United States Patent
Park et al.

(10) Patent No.: US 11,264,354 B2
(45) Date of Patent: Mar. 1, 2022

(54) WAFER LEVEL PACKAGE

(71) Applicant: Samsung Electronics Co., Ltd., Suwon-si (KR)

(72) Inventors: Jinwoo Park, Hwaseong-si (KR); Jungho Park, Cheonan-si (KR); Dahye Kim, Gwangmyeong-si (KR); Minjun Bae, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/869,988

(22) Filed: May 8, 2020

(65) Prior Publication Data
US 2021/0104489 A1 Apr. 8, 2021

(30) Foreign Application Priority Data
Oct. 8, 2019 (KR) .......... 10-2019-0124772

(51) Int. Cl.
*H01L 23/00* (2006.01)
*H01L 25/065* (2006.01)
*H01L 23/31* (2006.01)

(52) U.S. Cl.
CPC .......... *H01L 24/94* (2013.01); *H01L 23/3121* (2013.01); *H01L 24/14* (2013.01); *H01L 25/0657* (2013.01)

(58) Field of Classification Search
CPC ..... H01L 24/94; H01L 24/95; H01L 23/3121; H01L 25/0657; H01L 24/14
See application file for complete search history.

(56) References Cited

U.S. PATENT DOCUMENTS

| | | | |
|---|---|---|---|
| 8,253,034 B2 | 8/2012 | Kim et al. | |
| 8,847,369 B2* | 9/2014 | Yew | H01L 23/3128 257/669 |
| 8,952,552 B2 | 2/2015 | Zang et al. | |
| 8,994,155 B2 | 3/2015 | Tsai et al. | |
| 9,620,430 B2* | 4/2017 | Lu | H01L 21/561 |
| 9,728,479 B2 | 8/2017 | Chou | |
| 9,842,788 B2 | 12/2017 | Chen et al. | |
| 10,840,215 B2* | 11/2020 | Lu | H01L 21/561 |
| 2014/0021594 A1* | 1/2014 | Yew | H01L 23/562 257/669 |
| 2018/0190635 A1* | 7/2018 | Choi | H01L 25/0652 |
| 2019/0131271 A1* | 5/2019 | Kuo | H01L 23/49822 |
| 2019/0131284 A1 | 5/2019 | Jeng et al. | |

FOREIGN PATENT DOCUMENTS

| | | |
|---|---|---|
| JP | 20070173361 A | 7/2007 |
| KR | 101162508 B1 | 7/2012 |

* cited by examiner

*Primary Examiner* — Nicholas J Tobergte
(74) *Attorney, Agent, or Firm* — Harness, Dickey & Pierce, P.L.C.

(57) ABSTRACT

Provided are a wafer level package and a method of manufacturing the same, wherein an underfill sufficiently fills a space between a redistribution substrate and a semiconductor chip, thereby reducing warpage. The wafer level package includes a redistribution substrate including at least one redistribution layer (RDL), a semiconductor chip on the redistribution substrate, and an underfill filling a space between the redistribution substrate and the semiconductor chip. The underfill covers side surfaces of the semiconductor chip. The redistribution substrate includes a trench having a line shape and extending in a first direction along a first side surface of the semiconductor chip.

20 Claims, 12 Drawing Sheets

WAFER LEVEL PACKAGE

CROSS-REFERENCE TO RELATED APPLICATION

This application claims the benefit of Korean Patent Application No. 10-2019-0124772, filed on Oct. 8, 2019, in the Korean Intellectual Property Office, the disclosure of which is incorporated herein in its entirety by reference.

BACKGROUND

Inventive concepts relate to a semiconductor package, and more particularly, to a wafer level package including a wafer-level redistribution substrate.

With the rapid development of the electronics industry and user needs, electronic equipment is becoming lighter and more compact. With the downsizing and weight lightening of electronic equipment, semiconductor packages used therefor also become lighter and more compact, and semiconductor packages are required to have high performance, large capacity, and high reliability. In order to realize downsizing, weight lightening, high performance, large capacity, and high reliability, a semiconductor chip is highly integrated, and thus, a size of the semiconductor chip is reduced, and a semiconductor package is also becoming more compact accordingly. For example, semiconductor packages including a chip scale package (CSP), a wafer level package (WLP), a package-on-package (POP), a system-on-chip (SOC), a system-in-package (SIP), and the like have been introduced.

SUMMARY

Inventive concepts relate to a wafer level package and a method of manufacturing the same, wherein an underfill sufficiently fills a space between a redistribution substrate and a semiconductor chip, thereby reducing warpage.

Inventive concepts relate to a wafer level package (WLP) including a redistribution substrate including at least one redistribution layer (RDL), a semiconductor chip on the redistribution substrate, and an underfill filling a space between the redistribution substrate and the semiconductor chip. The redistribution substrate includes a trench having a line shape and extending in a first direction along a first side surface of the semiconductor chip. The underfill covers side surfaces of the semiconductor chip.

In addition, inventive concepts relate to a WLP including a redistribution substrate, a semiconductor chip, an underfill, and a sealant. The redistribution substrate includes a trench having a line shape. The trench extends in a first direction along a first side surface of the semiconductor chip. The semiconductor chip is mounted on the redistribution substrate through bumps. The underfill fills a space between the redistribution substrate and the semiconductor chip. The underfill covers side surfaces of the semiconductor chip. The sealant covers and seals the semiconductor chip and the underfill.

Further, inventive concepts relate to a WLP including a redistribution substrate, a chip stack structure on the redistribution substrate and having at least one memory chip, a semiconductor chip spaced apart from the chip stack structure and on the redistribution substrate, and an underfill filling a space between the redistribution substrate and the semiconductor chip. The redistribution substrate includes a first trench having a line shape. The first trench extends in a first direction along a first side surface of the semiconductor chip. The underfill covers side surfaces of the semiconductor chip.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1A:
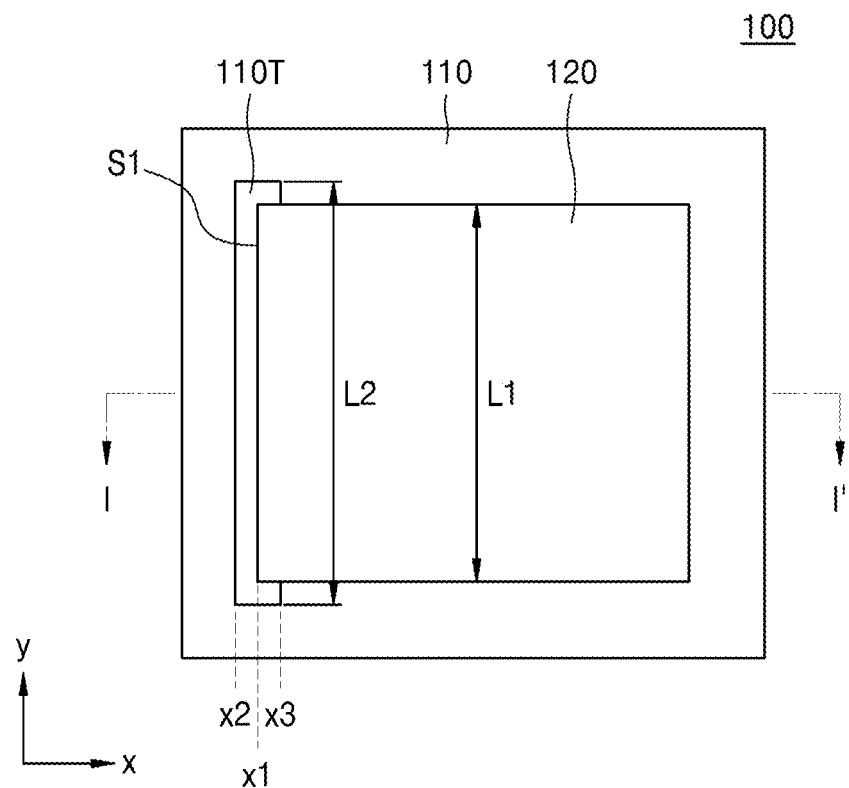
FIGS. 1A and 1B are a plan view and a cross-sectional view, respectively, of a wafer level package (WLP) according to embodiments.

Hereinafter, embodiments of inventive concepts will be described in detail with reference to the accompanying drawings. The same reference numerals are used to denote the same elements throughout the drawings, and repeated descriptions thereof will be omitted.

Figure 1B:
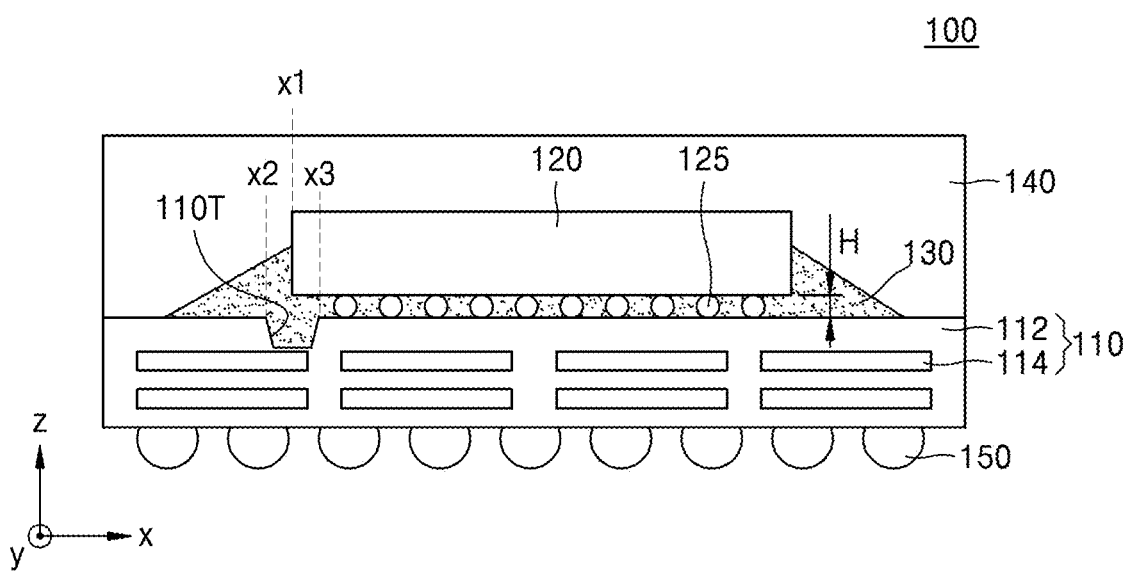

FIGS. 1A and 1B are a plan view and a cross-sectional view, respectively, of a WLP 100 according to embodiments. FIG. 1B is a cross-sectional view taken along line I-I' of FIG. 1A. For convenience of understanding, an underfill 130 and a sealant 140 are omitted from FIG. 1A.

Referring to FIGS. 1A and 1B, the WLP 100 of the present embodiment may include a redistribution substrate 110, a semiconductor chip 120, the underfill 130, the sealant 140, and an external connection member 150.

The redistribution substrate 110 may be formed based on a silicon wafer or a glass wafer, but is not limited thereto an other types of semiconductor and/or non-semiconductor materials may be used for the redistribution substrate 110. The redistribution substrate 110 may include a body 112 corresponding to a silicon wafer or a glass wafer, and at least one redistribution layer (RDL) 114 formed in the body 112. The RDL 114 may be formed of, for example, copper (Cu). However, a material of the RDL 114 is not limited to Cu. When the RDL 114 is formed of two or more layers, one or more RDLs 114 may be replaced with a Cu plate, according to an embodiment.

For reference, a redistribution substrate manufactured on a silicon wafer or a glass wafer through an RDL process and a semiconductor package based on the redistribution substrate are called a WLP. The redistribution substrate may have an RDL and a body having a thickness of several μm as substitutes for a prepreg and a core of a printed circuit board (PCB) substrate generally used in the semiconductor package. In addition, the redistribution substrate may be optimized for a fan-out WLP (FOWLP) larger than a semiconductor chip in response to a trend of an increased number of inputs/outputs (I/Os). The FOWLP may be advantageous in terms of cost reduction due to low cost of the redistribution substrate, and may also be advantageous in terms of heat radiation effect because the FOWLP is based on a thin silicon wafer or glass wafer instead of a thick insulator (e.g., a prepreg, a core, etc.) constituting a substrate, which is conventionally used.

The semiconductor chip 120 may be mounted on the redistribution substrate 110 through bumps 125. The semiconductor chip 120 may include a substrate body, a device layer, and a wiring layer. The semiconductor chip 120 may be a memory chip including a plurality of memory devices on the device layer. For example, the semiconductor chip 120 may include, in the device layer, volatile memory devices such as a dynamic random access memory (DRAM) and a static random access memory (SRAM), or non-volatile memory devices such as a flash memory, a phase-change random access memory (PRAM), a magnetic random access memory (MRAM), a ferroelectric random access memory (FeRAM), or a resistive random access memory (RRAM). According to an embodiment, the semiconductor chip 120 may be a logic chip including a plurality of logic devices on the device layer.

The semiconductor chip 120 may have a square shape as shown in FIG. 1A. However, the semiconductor chip 120 is not limited thereto, and may have a rectangular shape. The semiconductor chip 120 may have a first length L1 in a second direction (e.g., a y-direction). The first length L1 may be, for example, about 10 mm. However, the first length L1 of the semiconductor chip 120 is not limited to 10 mm. In addition, a thickness of the semiconductor chip 120 may be several tens to several hundreds of μm. As shown in FIG. 1A, a horizontal cross-sectional area of the semiconductor chip 120 may be smaller than that of the redistribution substrate 110.

The underfill 130 may fill a space between the redistribution substrate 110 and the semiconductor chip 120, and may cover a portion of side surfaces of the semiconductor chip 120. The underfill 130 may be formed of an underfill resin such as an epoxy resin, and may include a silica filler, a flux, or the like. The underfill 130 may protect the semiconductor chip 120 from physical and chemical impacts, and may perform a heat radiation function of radiating heat from the semiconductor chip 120. The underfill 130 may be classified into various types according to functions or characteristics thereof. For example, the underfill 130 may be classified into a capillary underfill, a non-conductive paste (NCP), a B-stage underfill, a molded underfill (MUF), a non-conductive film (NCF), and the like.

In the WLP 100 of the present embodiment, the underfill 130 may be a capillary underfill. The capillary underfill is a material for gap-filling bumps between a semiconductor chip and a substrate, and an initial underfill is made of only an epoxy having a low viscosity because a gap between the semiconductor chip and the substrate may be effectively filled by using a capillary phenomenon only when the viscosity is low. However, flow properties may be controlled according to the recent process temperature control, and a content of a filler is adjusted to have higher reliability, and thus, the underfill may have various viscosities ranging from low to high viscosity.

As described above, the semiconductor chip 120 is mounted on the redistribution substrate 110 through the bumps 125. In general, when heights of the bumps 125 are high, the underfill 130 may sufficiently fill inner spaces by penetrating into spaces between the redistribution substrate 110 and the semiconductor chip 120 and between the bumps 125. On the other hand, when the heights of the bumps 125 are low, the underfill 130 may not sufficiently filled, and a void may be generated between the redistribution substrate 110 and the semiconductor chip 120. In addition, because the underfill 130 does not smoothly penetrate into the space between the redistribution substrate 110 and the semiconductor chip 120, an overflow defect in which the underfill 130 covers at least a portion of an upper surface of the semiconductor chip 120 may occur.

The bumps 125 may each have a first height H. As shown in FIG. 1B, the heights of the bumps 125 may be substantially equal to an interval between the redistribution substrate 110 and the semiconductor chip 120. The first height H of the bumps 125 may be, for example, about 50 μm or less. In the WLP 100 of the present embodiment, the first height H of the bumps 125 may be about 30 μm or less. In some embodiments, the first height H of the bumps 125 may be as fine as about 10 μm.

The sealant 140 may cover the semiconductor chip 120 and the underfill 130, on the redistribution substrate 110. As shown in FIG. 1B, the sealant 140 may have a desired and/or alternatively predetermined thickness and cover the upper surface of the semiconductor chip 120. However, according to embodiments, the sealant 140 may not cover the upper surface of the semiconductor chip 120. Accordingly, the upper surface of the semiconductor chip 120 may be exposed from the sealant 140. The sealant 140 may be formed of, for example, an epoxy mold compound (EMC). The material of the sealant 140 is not limited to the EMC.

The external connection member 150 may be arranged under the redistribution substrate 110. The WLP 100 may be mounted on another external substrate or board via the external connection member 150. The external connection member 150 may be formed of, for example, Cu, aluminum (Al), silver (Ag), tin (Sn), gold (Au), solder, or the like. However, a material of the external connection member 150 is not limited to the above materials. The external connection member 150 may be formed of a multi-layer or a single layer. For example, when the external connection member 150 is formed of a multi-layer, the external connection member 150 may have a structure including a copper pillar and solder. When the external connection member 150 is formed as a single layer, the external connection member 150 may be formed of tin-silver solder, copper, or the like.

In the WLP 100 of the present embodiment, a trench 110T may be formed in the redistribution substrate 110 such that the underfill 130 may more sufficiently fill the spaces between the redistribution substrate 110 and the semiconductor chip 120 and between the bumps 125. The trench 110T may be formed in a dispensing region. Here, the dispensing region may refer to a region in which the underfill 130 is administrated during an underfill process. In other words, in the underfill process, the underfill 130 may be sprayed, via a dispenser, onto a dispensing region on the redistribution substrate 110, for example, onto an upper surface portion of the redistribution substrate 110 in front of a first side surface 51 of the semiconductor chip 120. Thereafter, the underfill 130 may penetrate into the space between the semiconductor chip 120 and the redistribution substrate 110 through a capillary action to fill the spaces between the semiconductor chip 120 and the redistribution substrate 110 and between the bumps. The trench 110T may be formed in a photo-imageable dielectric (PID) layer of the redistribution substrate 110. The PID layer refers to an upper layer of the body 112 of the redistribution substrate 110, which covers the RDL 114, and may be a photosensitive epoxy layer that may be patterned through a photo process.

The trench 110T may be formed in a line shape in the second direction (e.g., the y-direction) along the first side surface Si of the semiconductor chip 120 mounted on the redistribution substrate 110. As shown in FIG. 1A, a second length L2 of the trench 110T in the second direction (e.g., the y-direction) may be greater than the first length L1 of the semiconductor chip 120. However, the second length L2 of the trench 110T is not limited thereto. For example, the second length L2 of the trench 110T in the second direction (e.g., the y-direction) may be less than the first length L1 of the semiconductor chip 120, or may be substantially equal to the first length L1 of the semiconductor chip 120.

The trench 110T may be arranged in a lower portion of the first side surface Si of the semiconductor chip 120 in a first direction (e.g., a x-direction). In other words, at least a portion of the semiconductor chip 120 may overlap the trench 110T in the first direction (e.g., the x-direction). For example, when it is assumed that the first side surface Si of the semiconductor chip 120 is located at a first position x1 in the first direction (e.g., the x-direction) and both ends of the trench 110T are located at a second position x2 and a third position x3, respectively, in the first direction (e.g., the x-direction), the first position x1 may be located between the second position x2 and the third position x3. A position of the trench 110T is not limited to the above-described positions. For example, according to embodiments, the trench 110T may be arranged outside or inside the semiconductor chip 120 with respect to the first side surface Si of the semiconductor chip 120 in the first direction (e.g., the x-direction).

A vertical cross-section of the trench 110T may have various shapes. Here, the vertical cross-section refers to a cross-section perpendicular to the second direction (e.g., the y-direction), and is the same in the following descriptions. For example, as shown in FIG. 1B, the vertical cross-section may have a trapezoidal shape that becomes narrower toward a third direction (e.g., a z direction). However, the vertical cross-section of the trench 110T is not limited thereto. Various shapes of the vertical cross-section of the trench 110T will be described in more detail with reference to FIGS. 2A through 2E.

In the WLP 100 of the present embodiment, because the trench 110T is formed in the redistribution substrate 110, the underfill 130 may more sufficiently fill the spaces between the redistribution substrate 110 and the semiconductor chip 120 and between the bumps 125. Accordingly, the WLP 100 of the present embodiment may have limited and/or minimized warpage, and enhanced reliability based on the limited and/or minimized warpage.

More specifically, when the underfill process is applied in a WLP of a fan-out structure, that is, an FOWLP, the warpage is increased, such that a connection defect such as non-wetting between the redistribution substrate and the semiconductor chip may occur, thereby degrading reliability of the FOWLP. As the heights of the bumps used to mount the semiconductor chip are lowered, an effect of reducing the warpage may be increased. However, as the heights of the bumps are lowered, the underfill is not smoothly filled in the underfill process, and thus, the possibility of occurrence of an overflow defect may be increased.

However, in the WLP 100 of the present embodiment, because the trench 110T is formed in the redistribution substrate 110 by using a laser beam, a process of the underfill 130 is smoothly performed even when the heights of the bumps 125 are low, such that the underfill 130 may sufficiently fill the space between the redistribution substrate 110 and the semiconductor chip 120, and an overflow defect may be limited and/or prevented. Therefore, in the WLP 100 of the present embodiment, the warpage may be limited and/or minimized by the use of low bumps 125, and the overflow defect may be limited and/or prevented through a smooth process of the underfill 130. As a result, the reliability of the WLP 100 may be greatly improved.

FIGS. 2A through 2E are cross-sectional views illustrating various shapes of a trench formed in a redistribution substrate 110 of a WLP 100.

Figure 2A:
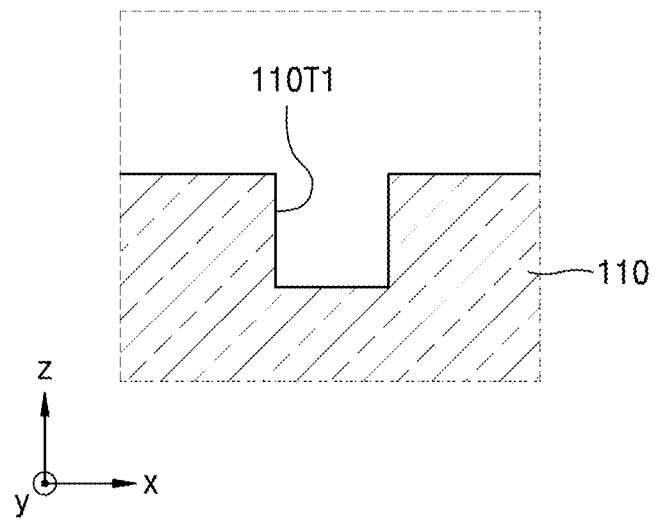
FIGS. 2A through 2E are cross-sectional views illustrating various shapes of a trench formed in a redistribution substrate of a WLP.

Referring to FIG. 2A, in the WLP 100 of the present embodiment, a vertical cross-section of a first trench 110T1 formed in the redistribution substrate 110 may have a rectangular shape. Accordingly, a lower portion of the first trench 110T1 may have substantially the same width as an upper portion thereof. Here, the width means a width in the first direction (e.g., the x-direction). A bottom surface of the first trench 110T1 may have a flat shape to some extent. Like the trench 110T of FIG. 1A, the first trench 110T1 may have a line shape extending in the second direction (e.g., the y-direction). Second to fifth trenches 110T2 to 110T5, as described below, may also have a line shape extending in the second direction (e.g., the y-direction).

Figure 2B:
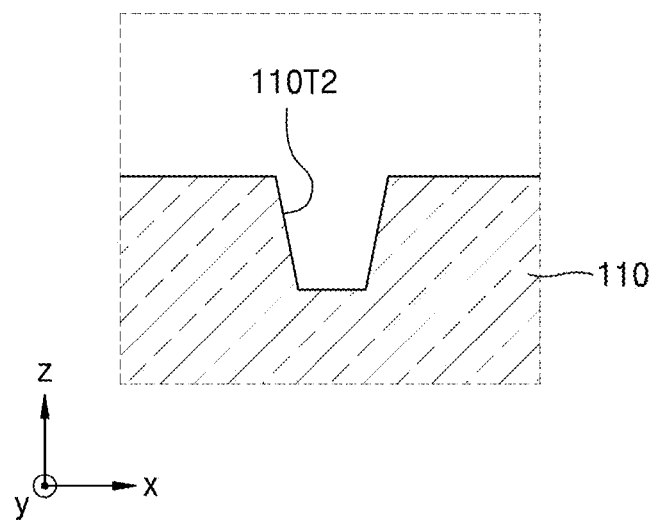

Referring to FIG. 2B, in the WLP 100 of the present embodiment, a vertical cross-section of the second trench 110T2 formed in the redistribution substrate 110 may have a trapezoidal shape. A trapezoid may have a shape that becomes narrower downwardly. Accordingly, a width of an upper portion of the second trench 110T2 may be greater than that of a lower portion thereof. A bottom surface of the second trench 110T2 may have a flat shape to some extent.

Figure 2C:
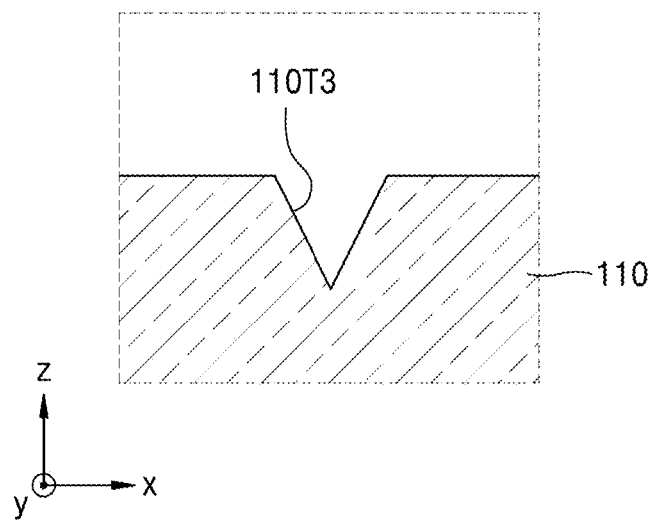

Referring to FIG. 2C, in the WLP 100 of the present embodiment, a vertical cross-section of the third trench 110T3 formed in the redistribution substrate 110 may have a triangular shape. A triangle may have a shape of which a vertex faces downward. Accordingly, a width of an upper portion of the third trench 110T3 may be greater than that of a lower portion thereof.

Figure 2D:
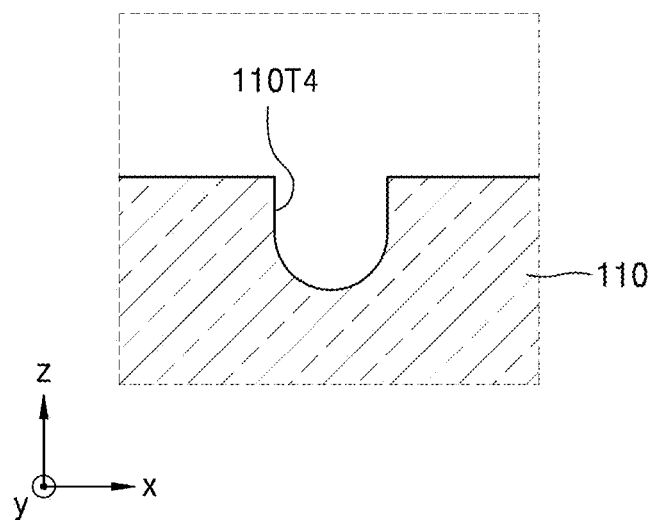

Referring to FIG. 2D, in the WLP 100 of the present embodiment, a vertical section of the fourth trench 110T4 formed in the redistribution substrate 110 may have a semicircular shape, or only a bottom portion thereof may have a semicircular shape and side surfaces thereof may be parallel to each other. When the vertical cross-section is semicircular, the fourth trench 110T4 may have a shape that becomes narrower downwardly. When only a bottom portion of the vertical cross-section of the fourth trench 110T4 is semicircular, a lower portion of the fourth trench 110T4 may have substantially the same width as an upper portion thereof. The bottom portion may be narrowed downwardly.

Figure 2E:
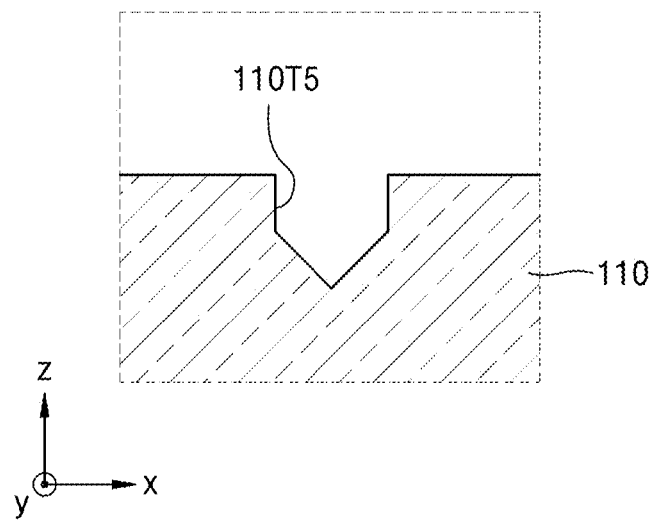

Referring to FIG. 2E, in the WLP 100 of the present embodiment, a vertical cross-section of the fifth trench 110T5 formed in the redistribution substrate 110 may have a pentagonal shape. A pentagon may have a bottom portion of an inverted triangular shape, and both sides thereof are parallel to each other. Accordingly, a lower portion of the fifth trench 110T5 may have substantially the same width as an upper portion thereof. In addition, the bottom portion may be narrowed downwardly.

Although five types of vertical cross-sections of the trench formed in the redistribution substrate 110 have been described above, the shapes of the vertical cross-sections of the trench are not limited to the above five types. For example, according to embodiments, the vertical cross-section of the trench formed in the redistribution substrate 110 may have various shapes.

Figure 3:
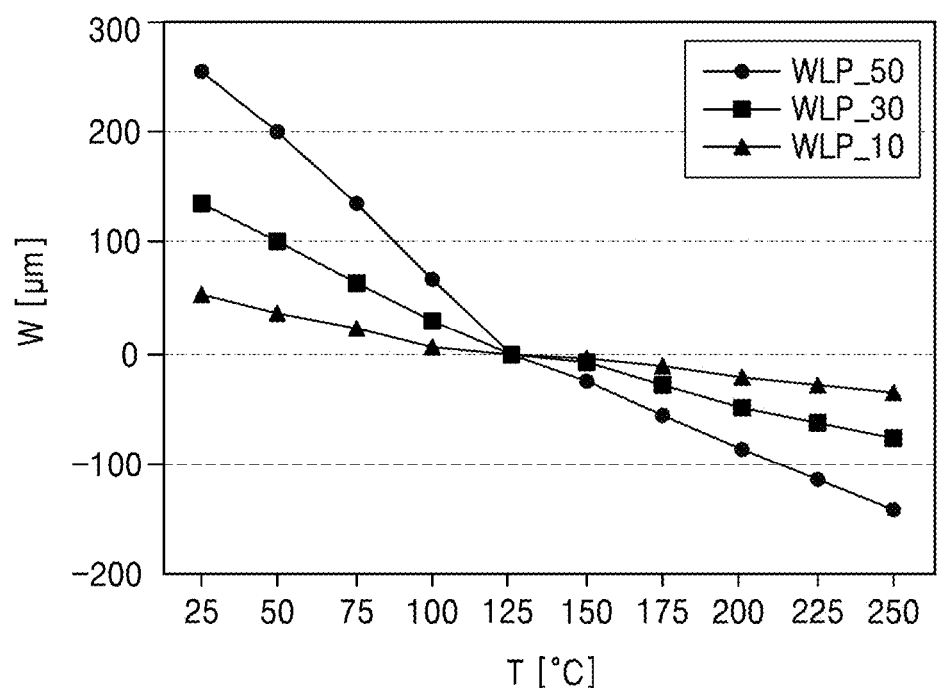
FIG. 3 is a graph illustrating warpage of a WLP according to a temperature and a height of a bump.

FIG. 3 is a graph illustrating warpage of a WLP according to a temperature and a height of a bump 125. A x-axis represents a temperature in a unit of ° C., and a y-axis represents warpage in a unit of μm.

Referring to FIG. 3, the graph shows the warpage according to the temperature, with respect to a WLP WLP_50 in which the heights of the bumps 125 are 50 μm, a WLP WLP_30 in which the heights of the bumps 125 are 30 μm, and a WLP WLP_10 in which the heights of the bumps 125 are 10 μm. Here, when the warpage has a positive (+) value, it may mean that the WLP is bent upwardly convexly, and when the warpage has a negative (−) value, it may mean that the WLP is bent downwardly convexly. In addition, the warpage may be calculated by a difference in height between a lowest portion and a highest portion in the same plane in the WLP. For example, when a lower surface of the redistribution substrate of the WLP is used as a reference, the warpage may be calculated by a difference in height between a lowest portion and a highest portion of a lower surface of the substrate, after the warpage is generated. Each of the three WLPs WLP_50, WLP_30, and WLP_10 may be, for example, the WLP 100 of the present embodiment.

As can be seen from the graph, it may be seen that all three WLPs WLP_50, WLP_30, and WLP_10 have warpage of a positive (+) value at room temperature, and the warpage decreases as the temperature increases. In addition, it may be seen that the warpage is changed to a negative (−) value starting from about 125° C., and the warpage increases as the temperature increases. For reference, a size of the warpage may be determined by an absolute value of the warpage. When comparing the three WLPs WLP_50, WLP_30, and WLP_10, it may be seen that as the heights of the bumps 125 are small, the warpage is relatively small, and a change in the warpage according to the temperature is also small.

In the WLP 100 of the present embodiment, because the trench 110T is formed in the redistribution substrate 110, the underfill may sufficiently fill the space between the redistribution substrate 110 and the semiconductor chip 120 without defects such as voids or overflows even though the heights of the bumps 125 are low. Therefore, the WLP 100 of the present embodiment may allow the underfill 130 to sufficiently fill the space between the redistribution substrate 110 and the semiconductor chip 120, while limiting and/or minimizing the warpage by lowering the heights of the bumps 125. As a result, the WLP 100 of the present embodiment enables a reliable WLP to be implemented.

Figure 4A:
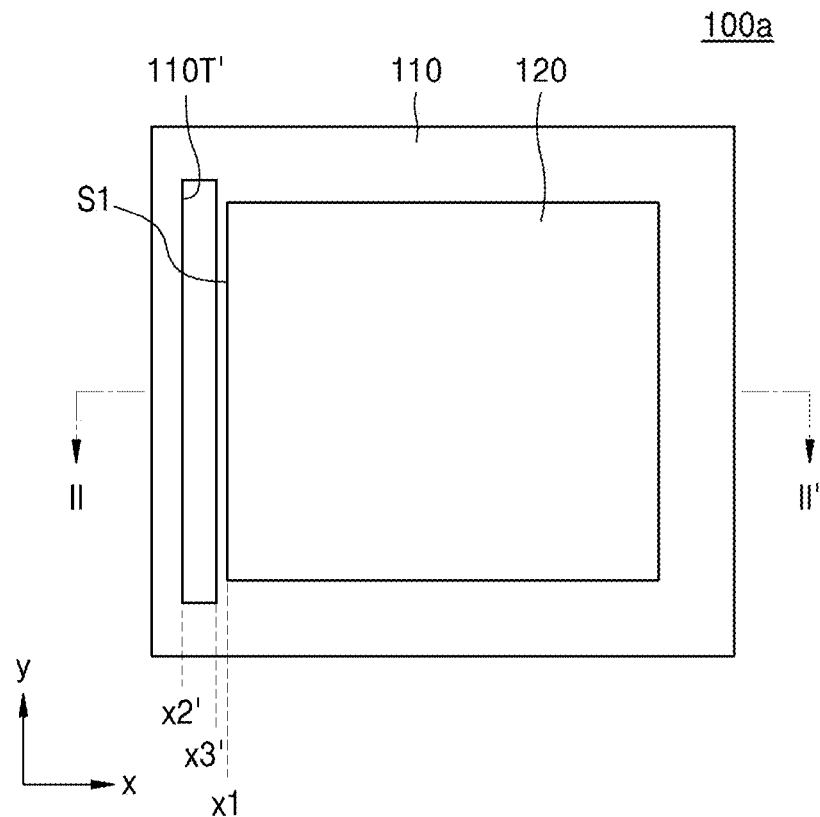
FIGS. 4A and 4B are a plan view and a cross-sectional view, respectively, of a WLP according to embodiments.
Figure 4B:
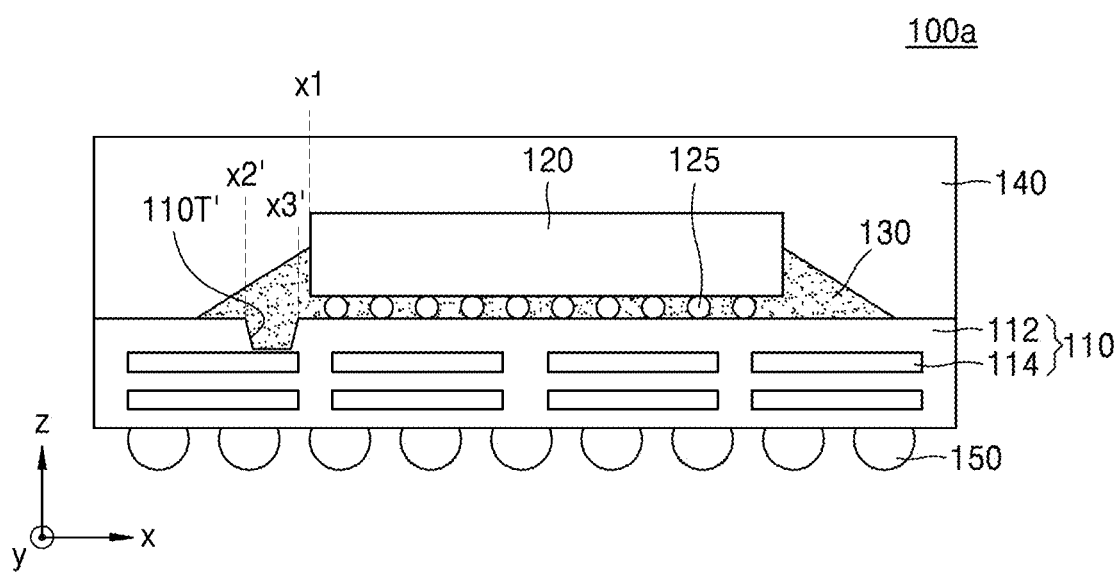

FIGS. 4A and 4B are a plan view and a cross-sectional view, respectively, of a WLP 100a according to embodiments. FIG. 4B is a cross-sectional view taken along line II-II' of FIG. 4A. For convenience of understanding, the underfill 130 and the sealant 140 are omitted from FIG. 4A. The descriptions already made with reference to FIGS. 1A through 3 will be briefly provided or omitted.

Referring to FIGS. 4A and 4B, the WLP 100a of the present embodiment may be different from the WLP 100 of FIG. 1A in terms of a position of a trench 110T'. More specifically, in the WLP 100a of the present embodiment, the trench 110T' may be arranged on a portion of the redistribution substrate 110 outside the semiconductor chip 120 without overlapping the semiconductor chip 120 in the first direction (e.g., the x-direction). In other words, when the first side surface 51 of the semiconductor chip 120 is located at the first position x1 in the first direction (e.g., the x-direction) and both ends of the trench 110T' are located at a second position x2' and a third position x3' in the first direction (e.g., the x-direction), both the second position x2' and the third position x3' may be located at a left side of the first position x1. A structure of the trench 110T' in the WLP 100a of the present embodiment, as described above with reference to FIGS. 8A through 8C, may be suitable for a case in which the semiconductor chip 120 is first mounted on the redistribution substrate 110 and then the trench 110T' is formed by a laser beam.

Figure 5A:
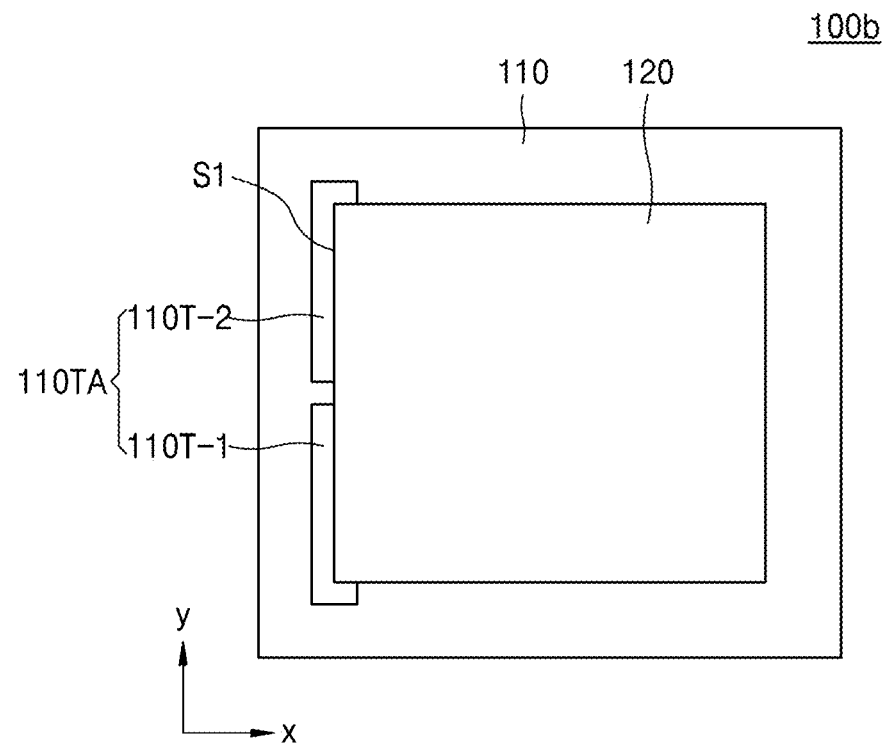
FIGS. 5A and 5B are plan views of WLPs according to embodiments.
Figure 5B:
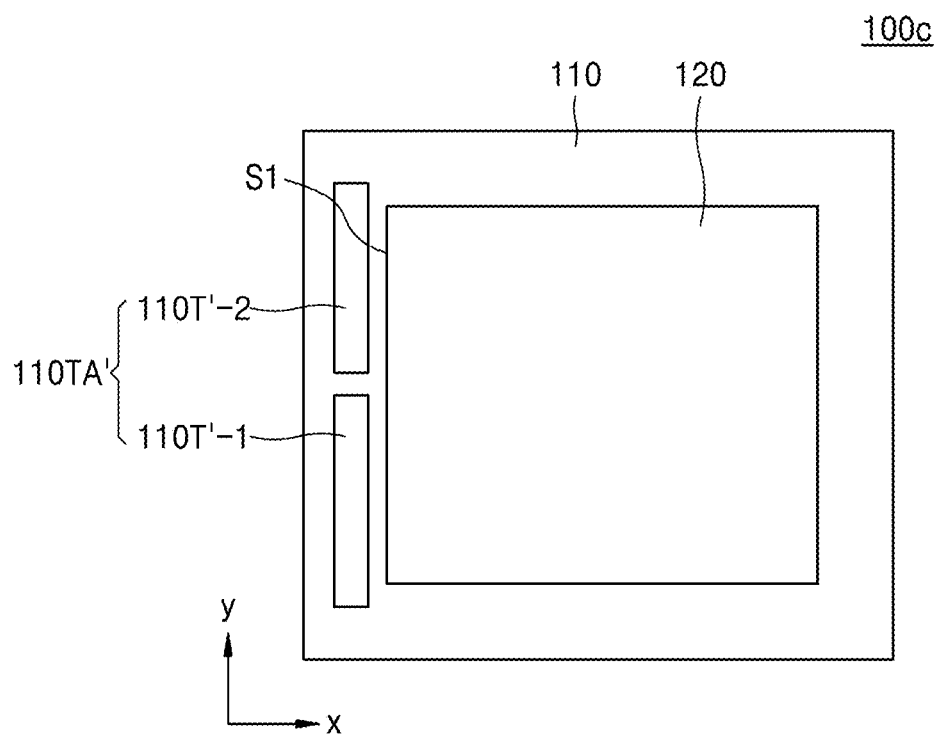

FIGS. 5A and 5B are plan views of WLPs 100b and 100c according to embodiments. For convenience of understanding, the underfill 130 and the sealant 140 are omitted from FIGS. 5A and 5B. The descriptions already made with reference to FIGS. 1A through 4B will be briefly provided or omitted.

Referring to FIG. 5A, the WLP 100b may be different from the WLP 100 of FIG. 1A in terms of a structure of a trench 110TA. More specifically, in the WLP 100b of the present embodiment, the trench 110TA may be formed in the redistribution substrate 110 in a line shape in the second direction (e.g., the y-direction) along the first side surface 51 of the semiconductor chip 120, and may include two sub-trenches (e.g., first and second sub-trenches) 110T-1 and 110T-2. That is, the trench 110TA may include the first sub-trench 110T-1 and the second sub-trench 110T-2 spaced apart from each other in the second direction (e.g., the y-direction). Each of the first sub-trench 110T-1 and the second sub-trench 110T-2 may overlap at least a portion of the semiconductor chip 120 in the first direction (e.g., the x-direction). Accordingly, the first side surface 51 of the semiconductor chip 120 may be located on the first sub-trench 110T-1 and the second sub-trench 110T-2.

In the WLP 100b of the present embodiment, the trench 110TA includes the two sub-trenches (e.g., first and second sub-trenches) 110T-1 and 110T-2, but the number of sub-trenches is not limited to two. For example, the trench 110TA may include three or more sub-trenches according to embodiments.

Referring to FIG. 5B, the WLP 100c of the present embodiment is similar to the WLP 100b of FIG. 4A in terms of a structure of a trench 110TA', but may be different from the WLP 100b of FIG. 4A in terms of a position of the trench 110TA' on the redistribution substrate 110. More specifically, in the WLP 100c of the present embodiment, the trench 110TA' may be formed in the redistribution substrate 110 in a line shape in the second direction (e.g., the y-direction) along the first side surface 51 of the semiconductor chip 120, and may include two sub-trenches (e.g., first and second sub-trenches) 110T'-1 and 110T'-2. That is, the trench 110TA' may include the first sub-trench 110T'-1 and the second sub-trench 110T'-2 spaced apart from each other in the second direction (e.g., the y-direction). As shown in FIG. 5B, each of the first sub-trench 110T'-1 and the second sub-trench 110T'-2 may be located at a left outer side of the first side surface 51 of the semiconductor chip 120 in the first direction (e.g., x-direction). Accordingly, the first sub-trench 110T'-1 and the second sub-trench 110T'-2 do not overlap the semiconductor chip 120. In the WLP 100c of the present embodiment, the trench 110TA' may also include three or more sub-trenches according to embodiments.

Figure 6:
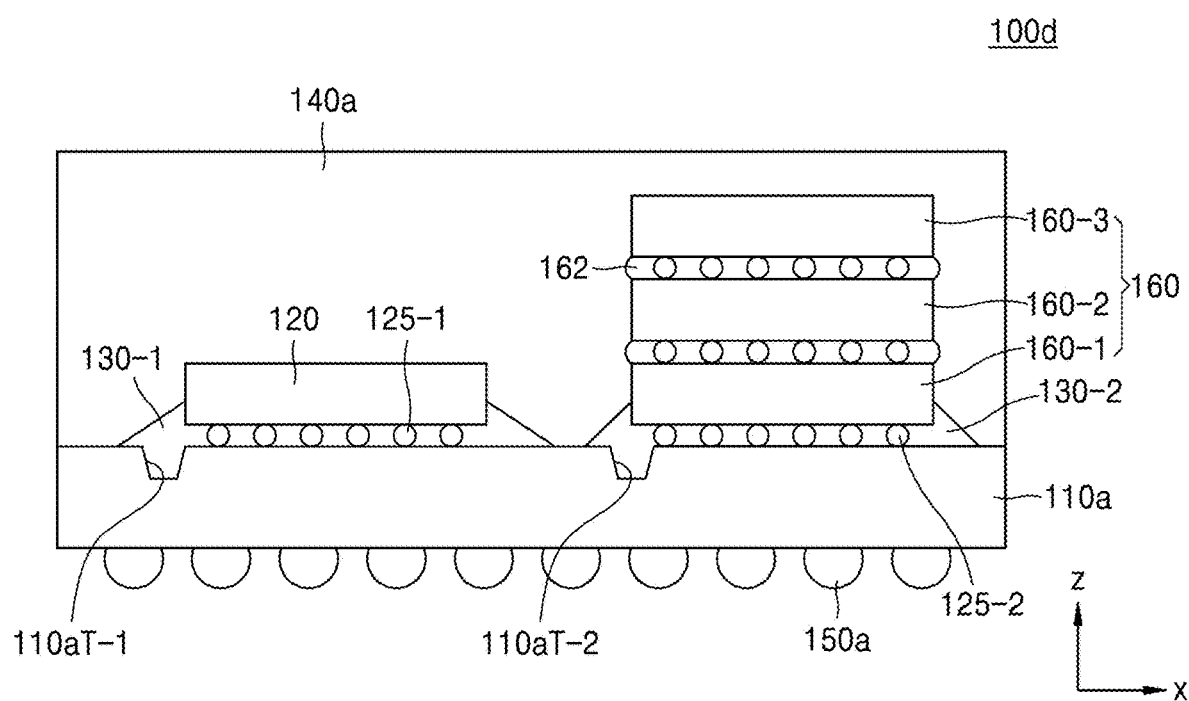
FIG. 6 is a cross-sectional view of a WLP according to an embodiment.

FIG. 6 is a cross-sectional view of a WLP 100d according to an embodiment. The descriptions already made with reference to FIGS. 1A through 5B will be briefly provided or omitted.

Referring to FIG. 6, the WLP 100d may include a redistribution substrate 110a, a semiconductor chip 120, first and second underfills 130-1 and 130-2, a sealant 140a, an external connection member 150a, and a chip stack structure 160.

The redistribution substrate 110a may be similar in function or structure to the redistribution substrate 110 of the WLP 100 of FIG. 1A. However, in the WLP 100d of the present embodiment, the redistribution substrate 110a may be different from the redistribution substrate 110 of the WLP 100 of FIG. 1A in that the redistribution substrate 110a is larger in size and the semiconductor chip 120 and the chip stack structure 160 are mounted thereon. In addition, two trenches (e.g., first and second trenches) 110aT-1 and 110aT-2 may be formed in the redistribution substrate 110a to correspond to the semiconductor chip 120 and the chip stack structure 160. For example, the first trench 110aT-1 may be formed in an upper surface portion of the redistribution substrate 110a corresponding to a left side of the semiconductor chip 120, and the second trench 110aT-2 may be formed in an upper surface portion of the redistribution substrate 110a corresponding to a left side of the chip stack structure 160.

Positions of the first trench 110aT-1 and the second trench 110aT-2 formed in the redistribution substrate 110a may vary according to a dispensing direction. For example, the first trench 110aT-1 may be formed in the upper surface portion of the redistribution substrate 110a corresponding to the left side of the semiconductor chip 120, and the second trench 110aT-2 may be formed in an upper surface portion of the redistribution substrate 110a corresponding to a right side of the chip stack structure 160. According to embodiments, the second trench 110aT-2 corresponding to the chip stack structure 160 may be omitted.

Because the first and second trenches 110aT-1 and 110aT-2 are formed in the redistribution substrate 110a, the first and second underfills 130-1 and 130-2 may sufficiently fill spaces between the semiconductor chip 120 and the redistribution substrate 110a and between the chip stack structure 160 and the redistribution substrate 110a. Accordingly, a first bump 125-1 of the semiconductor chip 120 and a second bump 125-2 of the chip stack structure 160 may be sufficiently lowered in height. As a result, the WLP 100d of the present embodiment may have enhanced reliability by limiting and/or minimizing the warpage, and may also contribute to the downsizing of packages due to a reduction in the overall height.

The semiconductor chip 120 is as described for the semiconductor chip 120 of the WLP 100 of FIG. 1A. In the WLP 100d of the present embodiment, the semiconductor chip 120 may be a control chip or a processor chip. For example, the semiconductor chip 120 may be a graphic processor unit (GPU)/central processing unit (CPU)/system-on-chip (SOC) chip. The WLP 100 may be used in a server-oriented semiconductor device, a mobile-oriented semiconductor device, or the like, depending on types of devices included in the semiconductor chip 120.

The first and second underfills 130-1 and 130-2 are as described for the underfill 130 of the WLP 100 of FIG. 1A. However, according to embodiments, the second underfill 130-2 may be replaced with a non-conductive film (NCF). When the chip stack structure 160 is mounted on the redistribution substrate 110a through the NCF, the second trench 110aT-2 of the redistribution substrate 110a may be omitted.

The sealant 140a and the external connection member 150a are as described for the sealant 140 and the external connection member 150 of the WLP 100 of FIG. 1A, respectively. However, as shown in FIG. 6, the sealant 140a may cover the semiconductor chip 120, the chip stack structure 160, and the first and second underfills 130-1 and 130-2. Alternatively, according to some embodiments, the sealant 140a may not cover an upper surface of the chip stack structure 160. In this case, an upper surface of an uppermost semiconductor chip of the chip stack structure 160, that is, a third semiconductor chip 160-3 may be exposed from the sealant 140a.

The chip stack structure 160 may be mounted on the redistribution substrate 110a through the second bump 125-2, and may include at least one semiconductor chip. In the WLP 100d of the present embodiment, the chip stack structure 160 may include three semiconductor chips 160-1 to 160-3, for example, first to third semiconductor chips 160-1 to 160-3. However, the number of semiconductor chips of the chip stack structure 160 is not limited thereto. For example, according to embodiments, the chip stack structure 160 may include two, four, or more semiconductor chips.

The first to third semiconductor chips 160-1 to 160-3 of the chip stack structure 160 may have substantially similar structures. Accordingly, only the first semiconductor chip 160-1 arranged at a lowermost portion of the chip stack structure 160 will be described. The first semiconductor chip 160-1 may include a substrate body, a through silicon via (TSV), a pad, and the like. Here, the substrate body may include a substrate and a device layer. The TSV may be formed to penetrate the substrate body or penetrate only a substrate portion. For example, when the first semiconductor chip 160-1 is divided into a cell region and a pad region and the TSV is formed only in the pad region, the TSV may be formed to penetrate the entire substrate body.

The device layer of the first semiconductor chip 160-1 may include a plurality of memory devices. For example, the device layer may include volatile memory semiconductor devices such as a DRAM and a SRAM, or non-volatile memory devices such as a flash memory, a PRAM, an MRAM, a FeRAM, or a RRAM. In the WLP 100d of the present embodiment, the first to third semiconductor chips 160-1 to 160-3 may be high bandwidth memory (HBM) DRAM chips including DRAM devices in the device layers thereof.

The TSV may be formed to penetrate the substrate, and the TSV may also extend into the device layer. The TSV has a pillar shape and may include a barrier layer on an outer surface thereof and an inner buried conductive layer. The barrier layer may include at least one material selected from titanium (Ti), titanium nitride (TiN), tantalum (Ta), tantalum nitride (TaN), ruthenium (Ru), cobalt (Co), manganese (Mn), tungsten nitride (WN), nickel (Ni), and Nickel boron (NiB). The buried conductive layer may include at least one material selected from among a copper (Cu) alloy such as Cu, copper stannum (CuSn), copper magnesium (CuMg), copper nickel (CuNi), copper zinc (CuZn), copper palladium (CuPd), copper aurum (CuAu), copper rhenium (CuRe), and copper tungsten (CuW), a tungsten (W) alloy, Ni, Ru, and Co. A via insulating layer may be interposed between the TSV and the substrate or between the TSV and the device layer. The via insulating layer may be formed of, for example, an oxide film, a nitride film, a carbide film, a polymer, or a combination thereof.

The pad may be arranged on an upper surface of the substrate to be connected to the TSV. The pad may have a flat circular plate shape. However, a shape of the pad is not limited to the circular plate shape. For example, the pad may have an elliptical plate shape or a polygonal plate shape. In addition, the pad is not limited to a plate shape and may have a three-dimensional structure. A protective insulating layer may be formed on the upper surface of the substrate, and the TSV may extend through the protective insulating layer. Accordingly, the pad may be arranged on the TSV and the protective insulating layer.

Unlike the first semiconductor chip 160-1, the second and third semiconductor chips 160-2 and 160-3 may be stacked on the first semiconductor chip 160-1 via the bump 125-2 and an adhesive layer 162. The adhesive layer 162 may be interposed between two adjacent semiconductor chips to surround side surfaces of the bump 125-2. As shown in FIG. 6, the adhesive layer 162 may protrude outward from side surfaces of the second and third semiconductor chips 160-2 and 160-3. The adhesive layer 162 may be formed of, for example, an NCF. The NCF may be generally used as an adhesive layer when bonding semiconductor chips by using a thermal compression bonding (TCB) method in a semiconductor chip stacking process. As described above, according to embodiments, the first semiconductor chip 160-1 may also be mounted on the redistribution substrate 110a by using an adhesive layer such as an NCF, and in this case, the second trench 110aT-2 may be omitted from the redistribution substrate 110a.

For reference, a WLP 100d structure of the present embodiment is referred to as a 2.5-dimensional (2.5D) package structure. The 2.5D package structure may be a relative concept of a three-dimensional (3D) package structure in which all semiconductor chips are stacked in a single chip stack structure. The 2.5D package structure and the 3D package structure may be included in a SIP structure.

FIGS. 7A through 7G are schematic cross-sectional views illustrating a method of manufacturing a WLP according to embodiments, and are cross-sectional views corresponding to the cross-sectional view of FIG. 1B. The descriptions will be made with reference to FIGS. 1A and 1B, and the descriptions already made with reference to FIGS. 1A through 6 will be briefly provided or omitted.

Figure 7A:
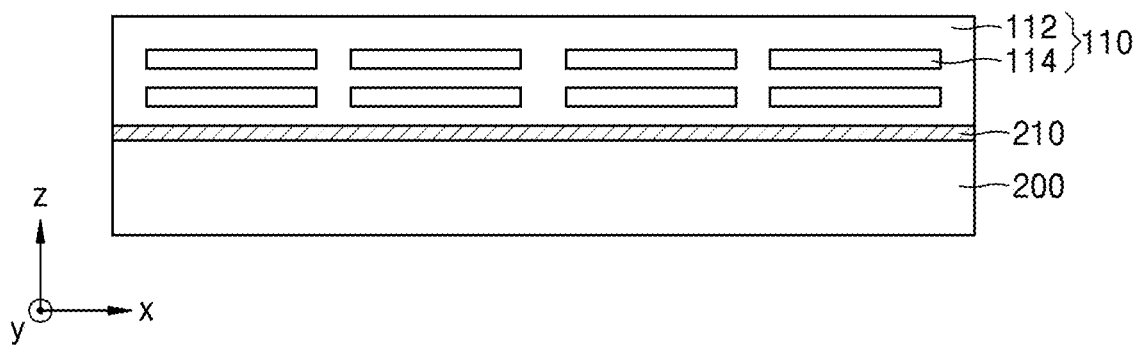
FIGS. 7A through 7G are schematic cross-sectional views illustrating a method of manufacturing a WLP according to embodiments.

Referring to FIG. 7A, the redistribution substrate 110 is formed on a first carrier substrate 200. The redistribution substrate 110 is as described for the redistribution substrate 110 of the WLP 100 of FIG. 1A. However, in the current operation, a trench may not be formed in the redistribution substrate 110.

The redistribution substrate 110 may be coupled to the first carrier substrate 200 by using a coupling layer 210. The coupling layer 210 may be formed of, for example, metal. When the coupling layer 210 is formed of metal, the redistribution substrate 110 may be coupled to the first carrier substrate 200 by forming the coupling layer 210 on the first carrier substrate 200 and then forming the redistribution substrate 110 on the coupling layer 210. The coupling layer 210 may have, for example, a double-layer structure of Cu/Ti.

In some embodiments, the coupling layer 210 may be formed of an adhesive material. When the coupling layer 210 is formed of an adhesive material, the redistribution substrate 110 may be formed on a separate wafer and then coupled to the first carrier substrate 200 by using the coupling layer 210.

Figure 7B:
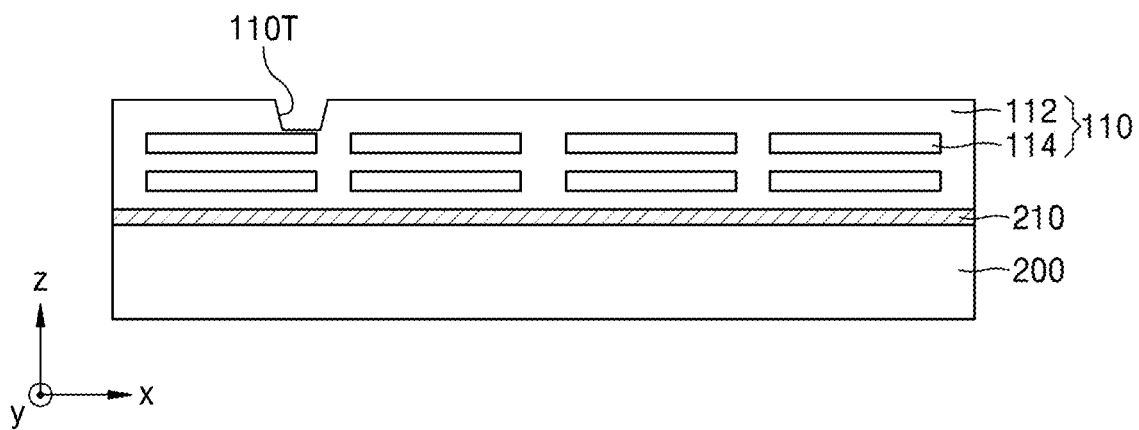

Referring to FIG. 7B, a trench 110T is formed in the dispensing region of the redistribution substrate 110 by using a laser beam. According to embodiments, the trench 110T may be formed by a photo process and/or an etching process. A structure and a position of the trench 110T are as described with reference to FIGS. 1A through 2E. For example, the trench 110T may be arranged at a position where at least a portion of the trench 110T overlaps the semiconductor chip 120 that is subsequently mounted on the redistribution substrate 110. However, according to embodiments, the trench 110T may be formed at a position where the trench 110T does not overlap the semiconductor chip 120. In addition, the trench 110T may have a linear shape extending in the second direction (e.g., the y-direction), and may have a trapezoidal shape of which a vertical cross-section becomes narrower downwardly. However, a shape of the vertical cross-section is not limited to the trapezoidal shape.

Figure 7C:
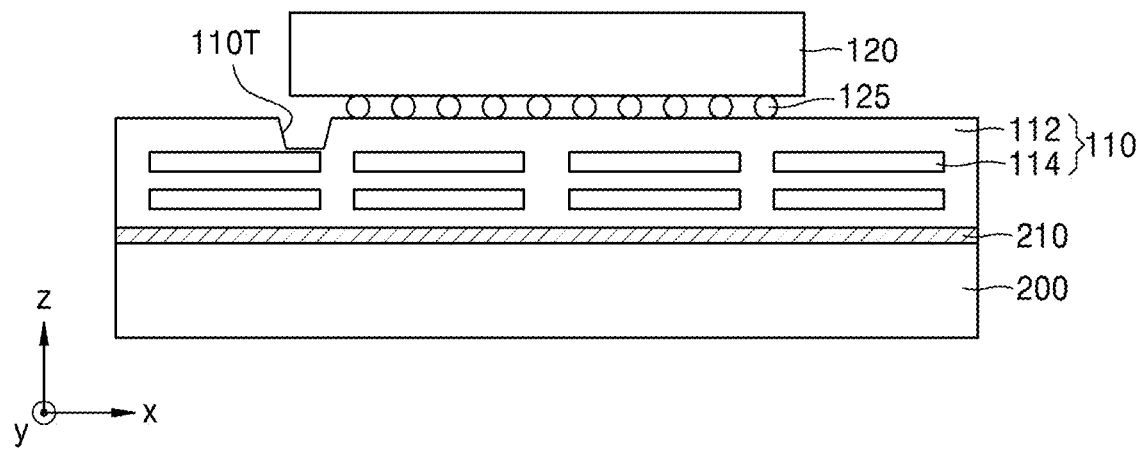

Referring to FIG. 7C, the semiconductor chip 120 is mounted on the redistribution substrate 110 by using the bumps 125. As described above, the lower the heights of the bumps 125, the more the warpage of the WLP 100 may be reduced. Accordingly, the bumps 125 may have a minimum height, and the semiconductor chip 120 may be mounted on the redistribution substrate 110. For example, the heights of the bumps 125 may be about 30 μm or less.

Figure 7D:
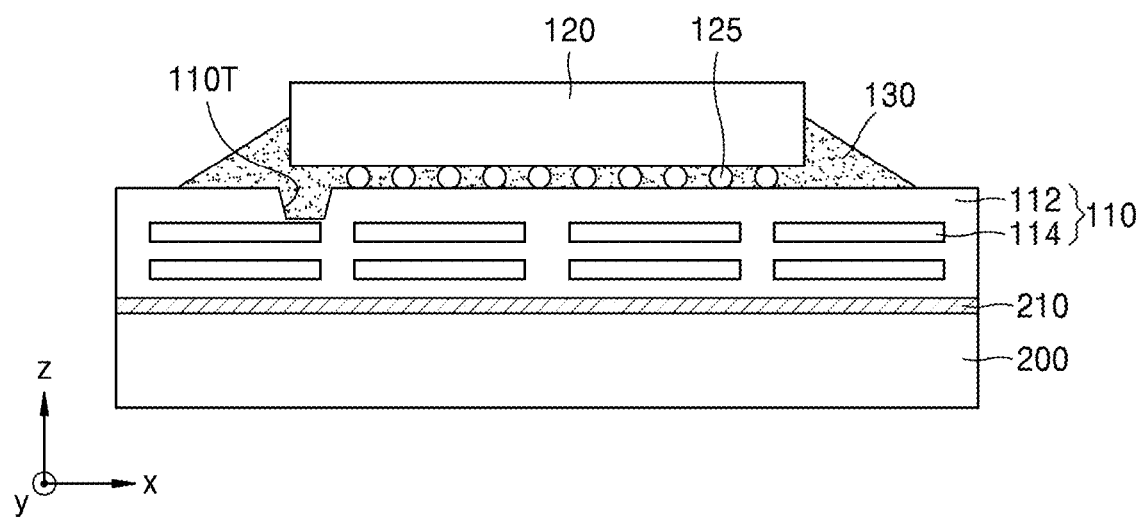

Referring to FIG. 7D, an underfill process is performed to fill the underfill 130 between the semiconductor chip 120 and the redistribution substrate 110 and between the bumps 125. The underfill 130 may also fill the trench 110T and cover the side surfaces of the semiconductor chip 120. The underfill process may be performed in such a manner that the underfill 130 is injected into the dispensing region through the dispenser, and the underfill 130 is permeated between the semiconductor chip 120 and the redistribution substrate 110 by using a capillary phenomenon to fill the inner spaces. As described above, because the trench 110T is formed in the dispensing region of the redistribution substrate 110, the underfill 130 may sufficiently fill the space between the semiconductor chip 120 and the redistribution substrate 110 without defects such as overflows due to the underfill 130.

Figure 7E:
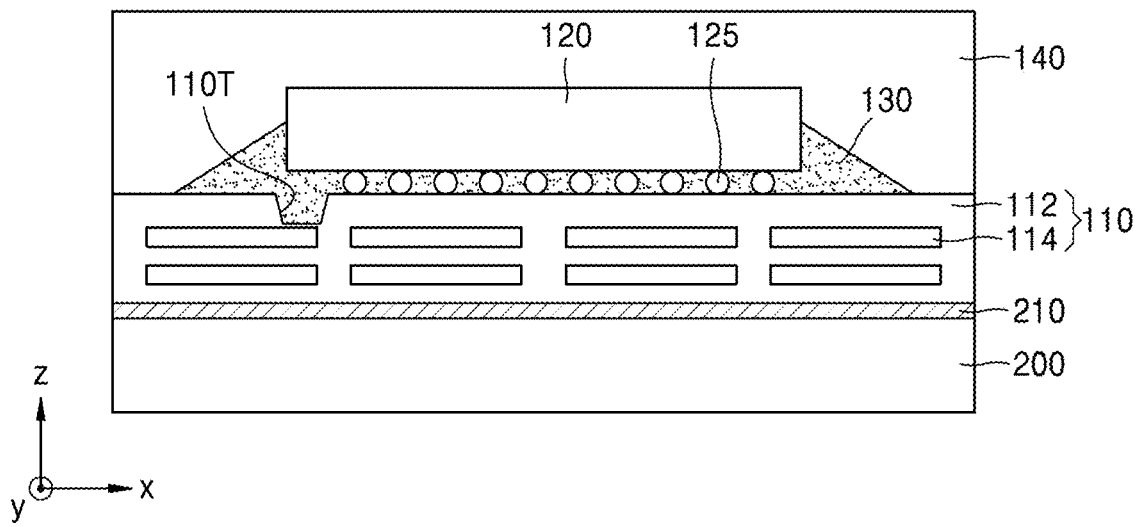

Referring to FIG. 7E, the sealant 140 is formed on the redistribution substrate 110 to cover the semiconductor chip 120 and the underfill 130. As shown in FIG. 7E, the sealant 140 may be formed to cover the upper surface of the semiconductor chip 120. However, in some embodiments, the sealant 140 may be formed to expose the upper surface of the semiconductor chip 120.

Figure 7F:
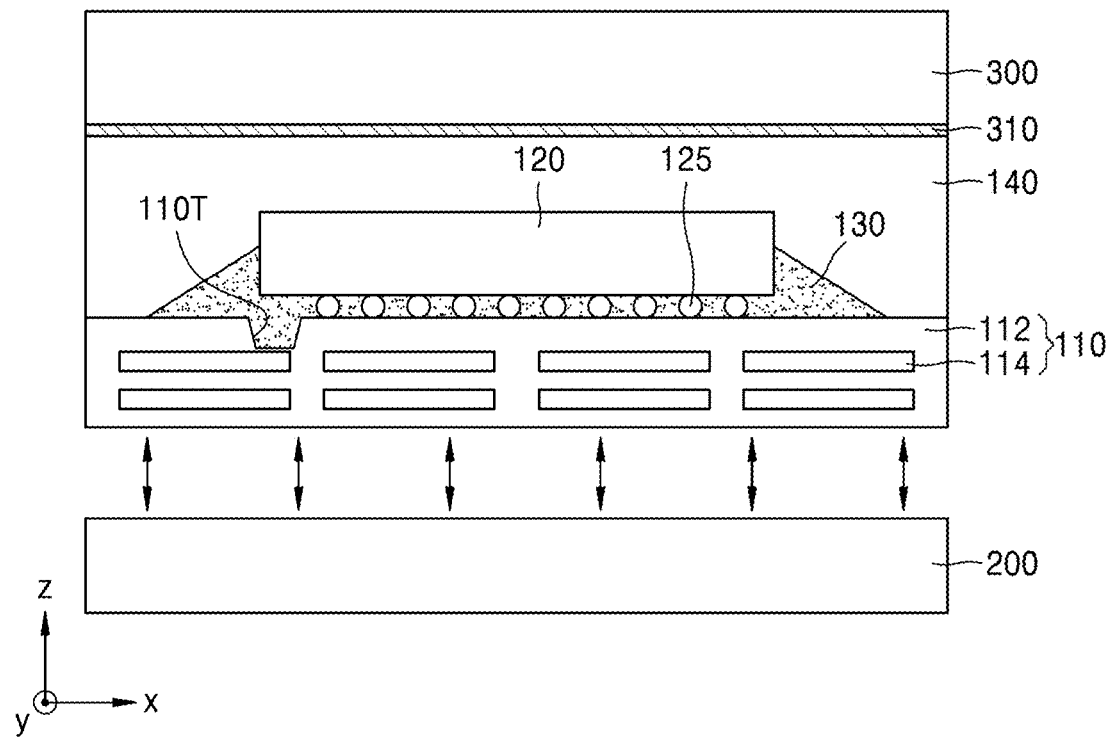

Referring to FIG. 7F, a second carrier substrate 300 is coupled to an upper surface of the sealant 140 through an adhesive layer 310. Thereafter, the first carrier substrate 200 is separated from the redistribution substrate 110. For example, the separation of the redistribution substrate 110 may be performed by irradiating a laser beam onto the coupling layer 210.

Figure 7G:
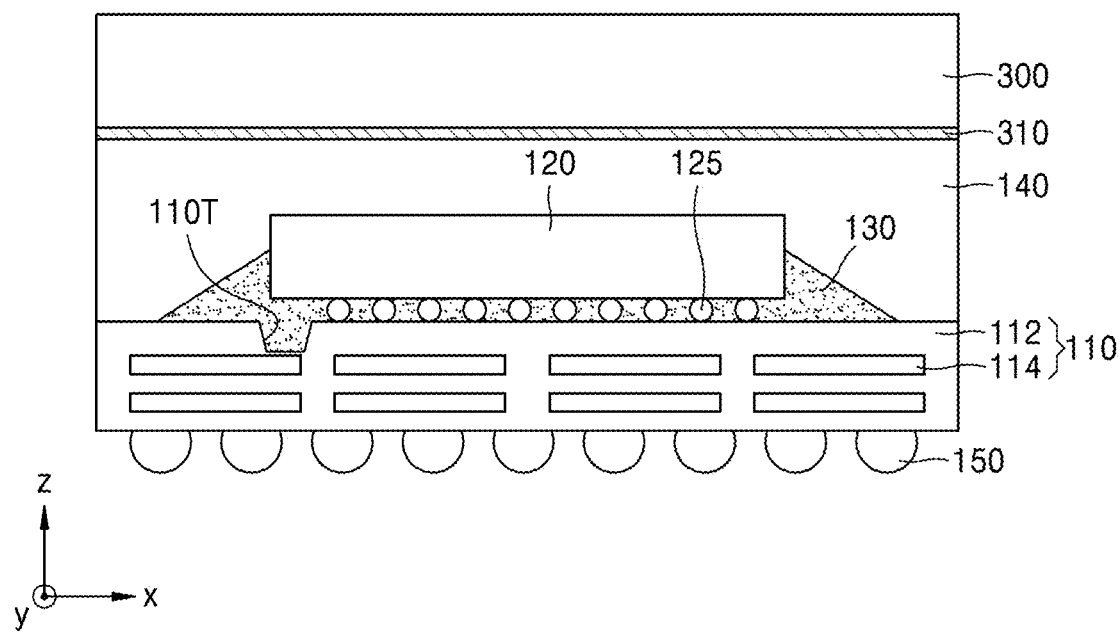

Referring to FIG. 7G, the external connection member 150 is attached to a lower surface of the redistribution substrate 110. As described above, the redistribution substrate 110 may be a wafer-level substrate. In addition, the sealant 140 may be formed to cover the entire wafer-level redistribution substrate 110. Accordingly, a dicing or singulation process may be required to separate an entire structure including the redistribution substrate 110 into individual WLPs each including a semiconductor chip 120 and a redistribution substrate 110 portion corresponding thereto. For example, after the external connection member 150 is attached, the entire structure including the redistribution substrate 110 is mounted on a dicing frame by using tape remove mounting (TRM), and is singulated by performing a dicing process using a blade or a laser beam, and thus, the WLP 100 as shown in FIG. 1A may be completed.

Figure 8A:
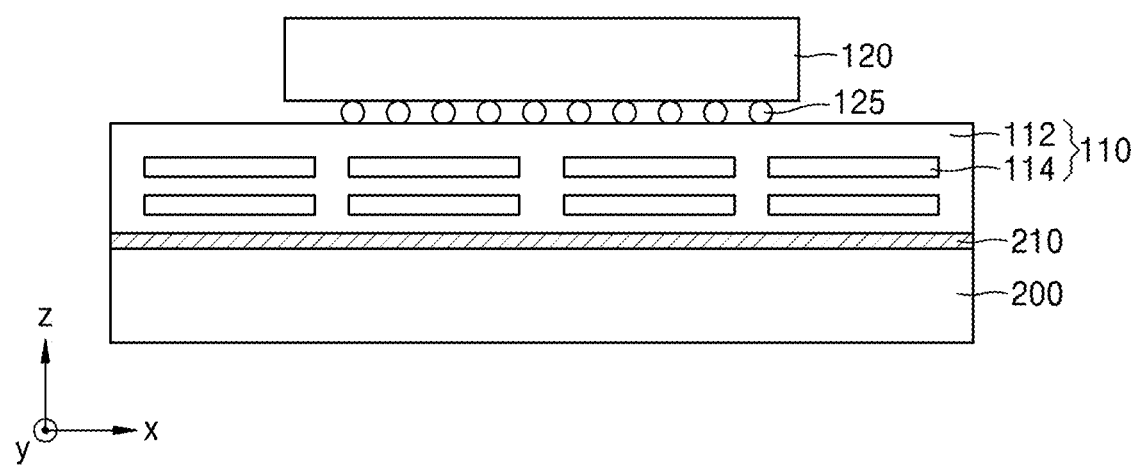
FIGS. 8A through 8C are schematic cross-sectional views illustrating a method of manufacturing a WLP according to embodiments.
Figure 8B:
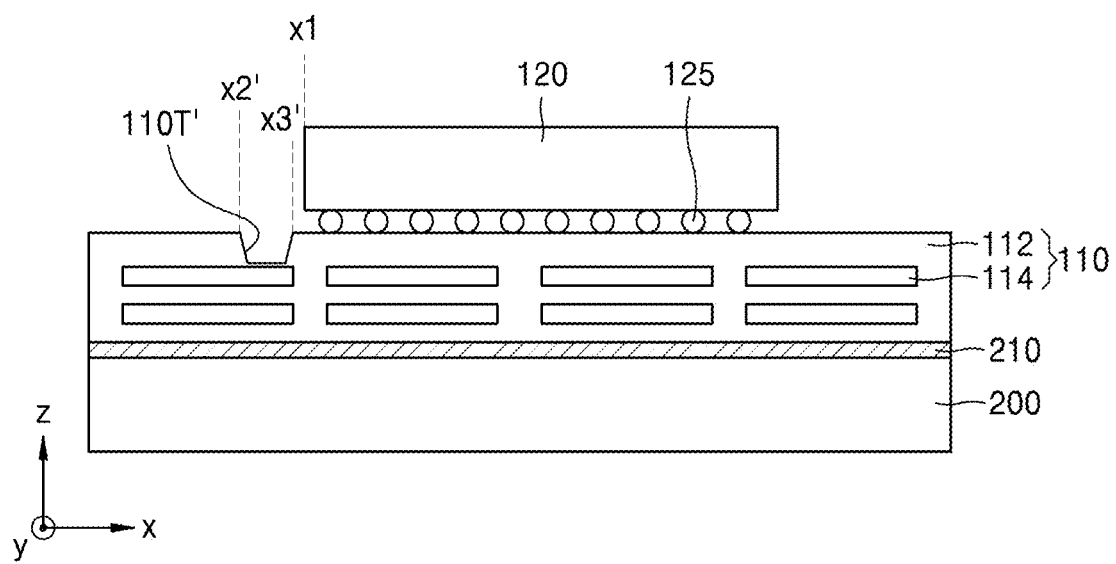
Figure 8C:
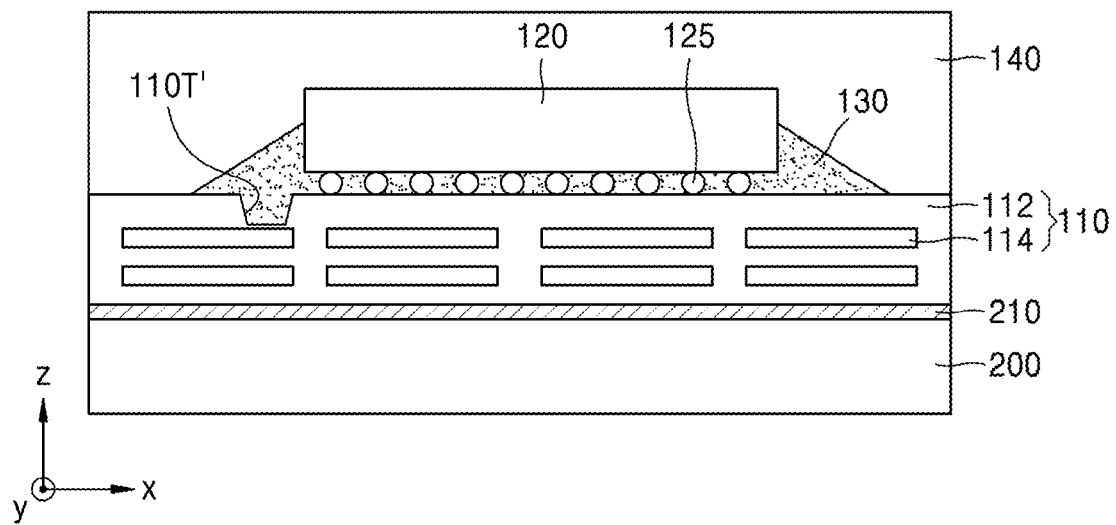

FIGS. 8A through 8C are schematic cross-sectional views illustrating a method of manufacturing a WLP according to embodiments, and are cross-sectional views corresponding to the cross-sectional view of FIG. 4B. The descriptions will be made with reference to FIGS. 4A and 4B, and the descriptions already made with reference to FIGS. 7A through 7G will be briefly provided or omitted. In terms of a manufacturing process, FIGS. 8A to 8C may correspond to FIGS. 7C to 7E.

Referring to FIG. 8A, as in FIG. 7A, the redistribution substrate 110 is formed on the first carrier substrate 200, and then the semiconductor chip 120 is mounted on the redistribution substrate 110 by using the bumps 125. In other words, in a method of manufacturing the WLP 100a according to the present embodiment, the semiconductor chip 120 is first mounted on the redistribution substrate 110 before the trench is formed in the redistribution substrate 110.

Referring to FIG. 8B, a trench 110T' is formed in the dispensing region of the redistribution substrate 110 by using a laser beam. A structure and a position of the trench 110T' are as described with reference to FIGS. 2A through 2E and FIGS. 4A and 4B. For example, the trench 110T' is formed at a left outer portion of the first side surface 51 of the semiconductor chip 120, and thus, the trench 110T' does not overlap the semiconductor chip 120. However, according to embodiments, the trench 110T' may be formed to overlap the semiconductor chip 120. The trench 110T' may have a linear shape extending in the second direction (e.g., the y-direction), and may have a trapezoidal shape of which a vertical cross-section becomes narrower downwardly. However, a shape of the vertical cross-section is not limited to the trapezoidal shape.

Referring to FIG. 8C, an underfill process is performed to fill the underfill 130 between the semiconductor chip 120 and the redistribution substrate 110 and between the bumps 125. The underfill 130 may fill the trench 110T' and cover the side surfaces of the semiconductor chip 120. As described above, because the trench 110T' is formed in the dispensing region of the redistribution substrate 110, the underfill 130 may sufficiently fill the space between the semiconductor chip 120 and the redistribution substrate 110 without defects such as overflows due to the underfill 130.

After the underfill 130 is formed, the sealant 140 that covers the semiconductor chip 120 and the underfill 130 is formed on the redistribution substrate 110.

Thereafter, as described with reference to FIGS. 7F and 7G, the entire structure including the redistribution substrate 110 is singulated through a singulation process, and thus, the WLP 100a as shown in FIG. 4A may be completed.

While inventive concepts has been particularly shown and described with reference to embodiments thereof, it will be understood that various changes in form and details may be made therein without departing from the spirit and scope of the following claims.

What is claimed is:

1. A wafer level package (WLP) comprising:
a semiconductor chip;
a redistribution substrate including at least one redistribution layer (RDL), the semiconductor chip being on the redistribution substrate, the redistribution substrate including a trench having a line shape, the trench extending in a first direction along a first side surface of the semiconductor chip on the redistribution substrate; and
an underfill filling a space between the redistribution substrate and the semiconductor chip and the underfill covering side surfaces of the semiconductor chip.

2. The WLP of claim 1, wherein
at least a portion of the semiconductor chip overlaps the trench in a second direction perpendicular to the first direction, and
the underfill fills the trench and covers the first side surface.

3. The WLP of claim 1, wherein
a width of an upper portion of the trench is equal to a width of a lower portion of the trench, or
a width of the trench becomes narrower from the upper portion of the trench to the lower portion of the trench downwardly in a second direction perpendicular to the first direction.

4. The WLP of claim 1, wherein a cross-section of the trench in a direction perpendicular to the first direction is a triangle, a quadrangle, a trapezoid, or a semicircle.

5. The WLP of claim 1, further comprising:
a plurality of bumps between the semiconductor chip and the redistribution substrate, wherein
the bumps have heights of about 30 μm or less.

6. The WLP of claim 1, further comprising:
a plurality of bumps between the semiconductor chip and the redistribution substrate,
wherein the bumps have heights of about 10 μm or less.

7. The WLP of claim 1, further comprising:
a sealant covering the semiconductor chip and the underfill; and
an external connection member under the redistribution substrate,
wherein the external connection member has a fan-out structure.

8. The WLP of claim 1, wherein the trench is in a dispensing region of the redistribution substrate where the underfill is.

9. The WLP of claim 1, wherein
the redistribution substrate and the semiconductor chip each have a square shape,
the redistribution substrate has a planar area larger than an area of the semiconductor chip, and
the trench is longer than the semiconductor chip in the first direction.

10. The WLP of claim 1, wherein the redistribution substrate includes a silicon wafer or a glass wafer.

11. The WLP of claim 1, further comprising:
a memory chip and a control chip spaced apart from each other on the redistribution substrate,
wherein the semiconductor chip is the control chip.

12. A WLP comprising:
a semiconductor chip;
a redistribution substrate, the semiconductor chip being mounted on the redistribution substrate, the redistribution substrate including a trench having a line shape, the trench extending in a first direction along a first side surface of the semiconductor chip;
an underfill filling a space between the redistribution substrate and the semiconductor chip, the underfill covering side surfaces of the semiconductor chip; and
a sealant covering and sealing the semiconductor chip and the underfill.

13. The WLP of claim 12, wherein
at least a portion of the semiconductor chip overlaps the trench in a second direction perpendicular to the first direction, and
a width of an upper portion of the trench is equal to a width of a lower portion of the trench or a width of the trench becomes narrower from the upper portion of the trench to the lower portion of the trench downwardly in the second direction.

14. The WLP of claim 12, wherein the bumps have heights of about 10 μm or less.

15. The WLP of claim 12, further comprising:
an external connection member under the redistribution substrate in a fan-out structure.

16. The WLP of claim 12, wherein
the redistribution substrate and the semiconductor chip each have a square shape,
the redistribution substrate has a planar area larger than that of the semiconductor chip, and
the trench is longer than the semiconductor chip in the first direction.

17. A WLP comprising:
a semiconductor chip;
a redistribution substrate, the redistribution substrate including a first trench having a line shape, the first trench extending in a first direction along a first side surface of a semiconductor chip, the semiconductor chip being on the redistribution substrate;
a chip stack structure on the redistribution substrate and having at least one memory chip,
the semiconductor chip being spaced apart from the chip stack structure; and
an underfill filling a space between the redistribution substrate and the semiconductor chip, the underfill covering side surfaces of the semiconductor chip.

18. The WLP of claim 17, wherein
the underfill fills a space between the chip stack structure and the redistribution substrate, and
the redistribution substrate includes a second trench having a line shape, the second trench extending along any one side surface of the chip stack structure.

19. The WLP of claim 17, further comprising:
bumps between the semiconductor chip and the redistribution substrate, wherein
a width of an upper portion of the trench is equal to a width of a lower portion of the trench, or a width of the trench becomes narrower from the upper portion of the trench to the lower portion of the trench downwardly in a second direction perpendicular to the first direction, and
the bumps have a height of 10 μm or less.

20. The WLP of claim 17, further comprising:
an external connection member on a lower surface of the redistribution substrate, wherein
the chip stack structure includes a plurality of memory chips, and
the semiconductor chip is a control chip.

* * * * *

UNITED STATES PATENT AND TRADEMARK OFFICE
CERTIFICATE OF CORRECTION

PATENT NO. : 11,264,354 B2
APPLICATION NO. : 16/869988
DATED : March 1, 2022
INVENTOR(S) : Jinwoo Park et al.

It is certified that error appears in the above-identified patent and that said Letters Patent is hereby corrected as shown below:

On the Title Page

Item (56), Column 2, References Cited, Line 9, Should read:
U.S. PATENT DOCUMENTS
| | |
|---|---|
| 8,253,034 B2 | 8/2012 Kim et al. |
| 8,847,369 B2 * | 9/2014 Yew................ HO1L 23/3128 257/669 |
| 8,952,552 B2 | 2/2015 Zang et al. |
| 8,994,155 B2 | 3/2015 Tsai et al. |
| 9,620,430 B2 * | 4/2017 Lu................ HO1L 21/561 |
| 9,728,479 B2 | 8/2017 Chou |
| 9,842,788 B2 | 12/2017 Chen et al. |
| 10,497,675 B2 | 12/2019 Kwak et al. |
| 10,840,215 B2 * | 11/2020 Lu................HO1L 21/561 |
| 2014/0021594 A1 * | 1/2014 Yew................HO1L 23/562 257/669 |
| 2018/0190635 A1 * | 7/2018 Choi............HO1L 25/0652 |
| 2019/0131271 A1 * | 5/2019 Kuo................HO1L 23/49822 |
| 2019/0131284 A1 | 5/2019 Jeng et al. |

Signed and Sealed this
Twenty-eighth Day of February, 2023

Katherine Kelly Vidal
*Director of the United States Patent and Trademark Office*